(12) United States Patent
Zang et al.

(10) Patent No.: US 8,284,813 B2
(45) Date of Patent: Oct. 9, 2012

(54) F-P CAVITY AND LASER USING SAID F-P CAVITY

(75) Inventors: Erjun Zang, Beijing (CN); Yang Zhao, Beijing (CN); Jianping Cao, Beijing (CN); Ye Li, Beijing (CN); Zhanjun Fang, Beijing (CN)

(73) Assignee: National Istitute of Metrology P.R. China, Beijing (CN)

( * ) Notice: Subject to any disclaimer, the term of this patent is extended or adjusted under 35 U.S.C. 154(b) by 0 days.

(21) Appl. No.: 13/178,355

(22) Filed: Jul. 7, 2011

(65) Prior Publication Data

US 2011/0280271 A1 Nov. 17, 2011

Related U.S. Application Data

(63) Continuation-in-part of application No. 12/865,965, filed as application No. PCT/CN2009/000093 on Jan. 22, 2009, now Pat. No. 8,107,509.

(30) Foreign Application Priority Data

| Feb. 4, 2008 | (CN) | 2008 1 0004838 |
| Feb. 28, 2008 | (CN) | 2008 1 0082028 |
| Apr. 10, 2008 | (CN) | 2008 1 0091936 |
| May 12, 2008 | (CN) | 2008 1 0097085 |
| Jul. 7, 2010 | (CN) | 2010 1 0227275 |

(51) Int. Cl.
*H01S 3/081* (2006.01)
*H01S 3/083* (2006.01)

(52) U.S. Cl. .......... 372/93; 372/94

(58) Field of Classification Search .......... 372/93, 372/94; 359/858, 861
See application file for complete search history.

(56) References Cited

U.S. PATENT DOCUMENTS
6,172,823 B1 * 1/2001 Lehmann et al. .......... 359/834
* cited by examiner

*Primary Examiner* — Armando Rodriguez
(74) *Attorney, Agent, or Firm* — Finnegan, Henderson, Farabow, Garrett & Dunner, L.L.P.

(57) ABSTRACT

The disclosure discloses a Fabry-Perot (F-P) cavity, which is a folded confocal cavity integrally formed by a monolithic optical element, the folded confocal cavity having three reflection surfaces, wherein a first reflection surface is a plane and at the same time serves as an input/output coupling surface, a second reflection surface is a plane, and a third surface is a spherical surface, curvature radius of which is equal to half of a round trip geometric length of light in the folded confocal cavity. The invention further discloses a laser based on the F-P cavity. The solution of the disclosure solves the problems in existing folded F-P cavity, such as unsatisfactory stability, sensitive to outside inferences, bulky and complicated construction.

10 Claims, 4 Drawing Sheets

F-P CAVITY AND LASER USING SAID F-P CAVITY

CROSS REFERENCE TO RELATED APPLICATIONS

This application is a continuation-in-part of U.S. Application Ser. No. 12/865,965, filed on Oct. 28, 2010 now U.S. Pat. No. 8,107,509, which is a National Phase Application of International Application No. PCT/CN2009/000093, filed Jan. 22, 2009, and claims priority of Chinese Patent App. Nos. 200810004838.2, 200810082028.9, 200810091936.4, and 200810097085.4filed Feb. 4, 2008, Feb. 28, 2008, Apr. 10, 2008, and May 12, 2008, respectively, and further claims the benefit of priority of Chinese Patent Application No. 201010227275.0, filed on Jul. 7, 2010, the contents of all of which are incorporated herein by reference in their entirety.

TECHNICAL FIELD

This disclosure generally relates to laser techniques, and, specifically, to a Fabry-Perot (F-P) cavity, as well as a laser using the F-P cavity.

BACKGROUND

F-P cavity is an important tool in optical and laser research and is applicable to an optical device such as an external-cavity semiconductor laser and a monolithic solid laser etc. The retro-incident reflection light of the folded F-P cavity has a spectrum structure opposite to the F-P cavity and can provide optical feedback with narrow linewidth. Folded F-P cavities currently available are composed of discrete components. For example, FIG. 1 shows a structure, which is proposed by K. Döringshoff, I. Ernsting, R. H. Rinkleff, S. Schiller and A. Wicht. Such a folded F-P cavity (CAV) is composed of a coupler 101 and two reflectors 102 and 103, wherein the coupler 101 also serves as a folded reflector. The incident light enters the folded F-P cavity from the coupler 101. After reflection by reflectors 102 and 103 and coupler 101 in the cavity, two reflected beams are produced, that is, one reflected beam in the same direction and collinear with mirror-reflected light of the original incident light on the coupler 101, and one retro-incident reflection light beam in a direction opposite to and collinear with the incident light, wherein the latter can be output from the F-P cavity as light with additional function of frequency selection.

However, due to the difficulty of accurate tuning of discrete components, existing folded F-P cavities composed of discrete components are sensitive to outside inferences caused by sound, mechanical vibration and temperature vary. Further, such F-P cavity usually has a relatively large volume and poor system stability. Further, the confocal cavity in which the light path is folded once needs processing two spherical reflectors to form the resonance cavity, whereby increasing processing difficulties.

SUMMARY

Considering about this, an object of the disclosure is to provide a F-P cavity and a laser using the F-P cavity, so as to solve the above-mentioned problems in existing folded F-P cavity, such as unsatisfactory stability, sensitive to outside inferences, bulky and complicated construction.

The disclosure provides a F-P cavity which is a folded confocal cavity integrally formed by a monolithic optical element, the folded confocal cavity having three reflection surfaces, wherein a first reflection surface is a plane and at the same time serves as an input/output coupling surface, a second reflection surface is a plane, and a third surface is a spherical surface, curvature radius of which is equal to half of a round trip geometric length of light in the folded confocal cavity.

Alternatively, light enters into the folded confocal F-P cavity from an incident point on the first reflection surface and is normally incident on the third reflection surface, and back to the incident point on the first reflection surface after reflected by the third reflection surface, then turns to the second reflection surface and is normally incident on the third reflection surface after being totally-reflected by the second reflection surface, and is reflected back to the second reflection surface via the original path, and returns to the incident point on the first reflection surface after being totally-reflected by the second reflection surface again; or the light enters into the folded confocal F-P cavity from the incident point on the first reflection surface and is incident on the second reflection surface, and is normally incident on the third reflection surface after being totally-reflected by the second reflection surface, then is reflected back to the second reflection surface via the original path and returns to the incident point on the first reflection surface after being totally-reflected by the second reflection surface, after being folded there, the light is normally incident on the third reflection surface, and returns to the incident point on the first reflection surface from the third reflection surface.

Alternatively, the F-P cavity satisfies:

$$\begin{cases} R - \dfrac{1}{\cos\alpha}[y + 2(R-H)] + \dfrac{y}{\cos(\pi - 2\beta + \alpha)} = 0 \\ y = -\dfrac{x}{\tan\alpha} - 2(R-H) \\ y = \dfrac{x}{\tan(\pi - 2\beta + \alpha)} \end{cases}$$

where R denotes curvature radius of a spherical segment, H denotes a height of the spherical segment, α denotes a refractive angle of laser in the monolithic confocal cavity, β denotes an obtuse angle of the monolithic confocal cavity, and (x, y) is coordinates of the reflection point of the laser on a total reflection surface, in a coordinate system established using the center of circle as an origin of coordinates.

Alternatively, the second reflection surface of the F-P cavity serves as the total reflection surface on which a film is not plated or a high reflectivity film is plated dependent on the wavelength used.

Alternatively, for the laser waveband transmitted within the F-P cavity, the monolithic optical element is made of an optical glass, or optical crystal or quartz glass.

The disclosure further provides a laser using the monolithic folded confocal F-P cavity mentioned above as its F-P cavity.

Alternatively, the laser comprises: a semiconductor laser tube, a collimator, a beam splitter and the monolithic folded confocal F-P cavity.

The components in the laser are arranged such that, the laser light emitted by the semiconductor laser tube, after collimated by the collimator, a beam of which divided by the beam splitter is incident on the monolithic folded confocal F-P cavity; the retro-incident reflection light of the monolithic folded confocal F-P cavity returns to the semiconductor laser tube via the beam splitter along a path collinear with but in a direction opposite to the original incident light beam.

Alternatively, a half wave plate is arranged in a light path between the collimator and the beam splitter, or a half wave plate is arranged in a light path between the collimator and the grating.

Alternatively, the laser further comprises a combination of one or more of the following adjustment systems:

a resonance frequency adjustment system, which adjusts the resonance frequency determined by the monolithic folded F-P cavity by varying the light path of the monolithic folded F-P cavity;

a laser oscillation frequency adjustment system, which adjusts the laser oscillation frequency determined by frequency selection of the beam splitter, by varying the distance from the beam splitter to the monolithic folded F-P cavity or the distance from the beam splitter to the semiconductor laser tube;

a first frequency range adjustment system for light output by the semiconductor laser tube, which varies the frequency range of the light output by the semiconductor laser tube by varying the input current of the semiconductor laser tube; and a second frequency range adjustment system for light output by the semiconductor laser tube, which varies the frequency range of the light output by the semiconductor laser tube by varying the temperature of the semiconductor laser tube.

Alternatively, the beam splitter in the laser may be replaced with a grating.

It can be seen from the above that, in the F-P cavity and the laser using the F-P cavity proposed by the disclosure, the F-P cavity is integrally formed by a monolithic optical element, such that the F-P cavity has greatly improved stability and has advantages such as insensitive to outside inferences, compact volume, simple construction, and easy usage, etc. Moreover, by designing a surface to be a spherical surface, the F-P cavity becomes a folded confocal cavity, thereby no need to perform mode matching operation for different incident light beams, the operation is further simplified. Even if good mode matching is not realized, thanks to the characteristics of the confocal cavity, odd modes and even modes are degenerated respectively, thereby reducing possibilities of mode-hopping of the laser.

DETAILED DESCRIPTION OF PREFERRED EMBODIMENTS

In order to make the objects, technical solutions and advantages of the disclosure more clear, the disclosure is further described in detail below in combination with embodiments with reference to accompanying figures.

The applicant has discovered through long time studies and practices that, the F-P cavity composed of discrete components is sensitive to outside inferences caused by sound, mechanical vibration and temperature influence, and has a relatively large volume and poor system stability. Meanwhile, since a non-confocal F-P cavity needs to perform mode matching for different incident beams, the operation thereof is more complicated than the confocal F-P cavity. When good matching is not realized, multimode readily occurs and mode-hopping possibility increases, thereby affecting tracking and locking of the laser. Moreover, the confocal cavity with the light path folded once needs processing two spherical reflectors to form the resonance cavity and involves very complicated processes, so the wide use thereof is hindered.

To this end, the disclosure provides a F-P cavity which is a folded confocal cavity integrally formed by a monolithic optical element, the folded confocal cavity having three reflection surfaces, wherein a first reflection surface is a plane and at the same time serves as an input/output coupling surface, a second reflection surface is a plane, and a third surface is a spherical surface, curvature radius of which is equal to half of a round trip geometric length of light in the folded confocal cavity. It should be emphasized that, the spherical surface in the disclosure is not necessarily a very strict spherical surface. All other slight variants within an allowable error range in actual applications, known by those skilled in the art, fall into the scope of protection of the disclosure, for example, a curved surface approximating to the spherical surface, or a surface of other shape which is only partially satisfied.

Figure 1:
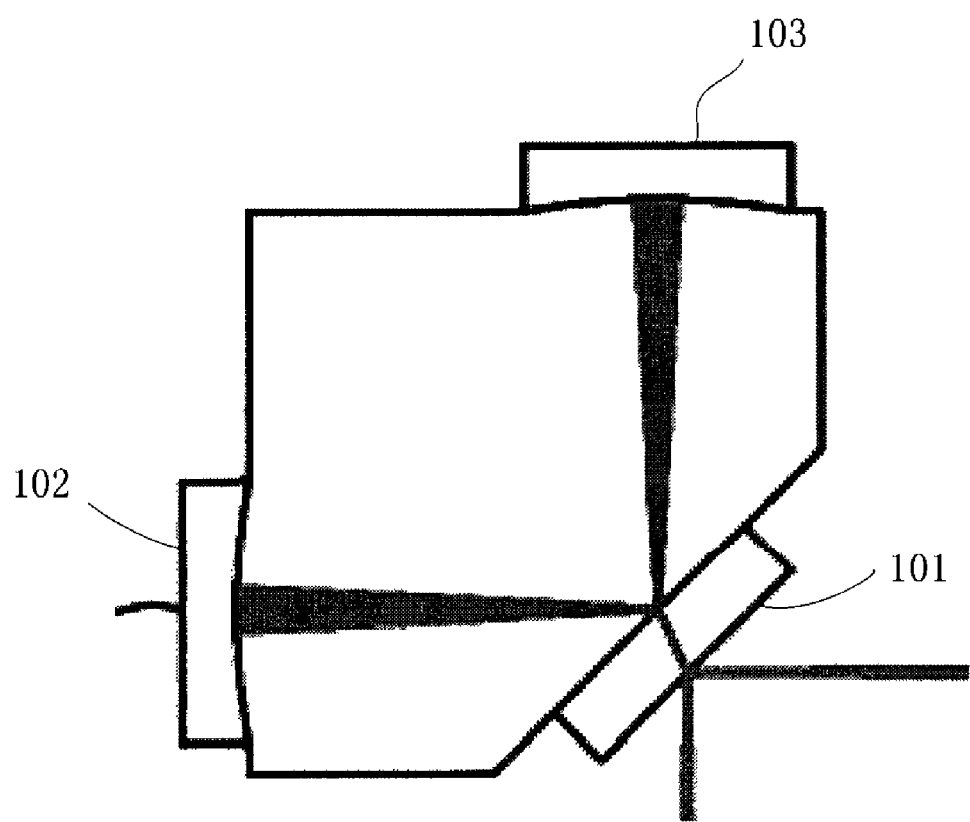
FIG. 1 schematically shows the structure of a folded confocal-F-P cavity of the prior art, which is composed of discrete components, proposed by K. Döringshoff, I. Ernsting, R. H. Rinkleff, S. Schiller and A. Wicht.
Figure 2:
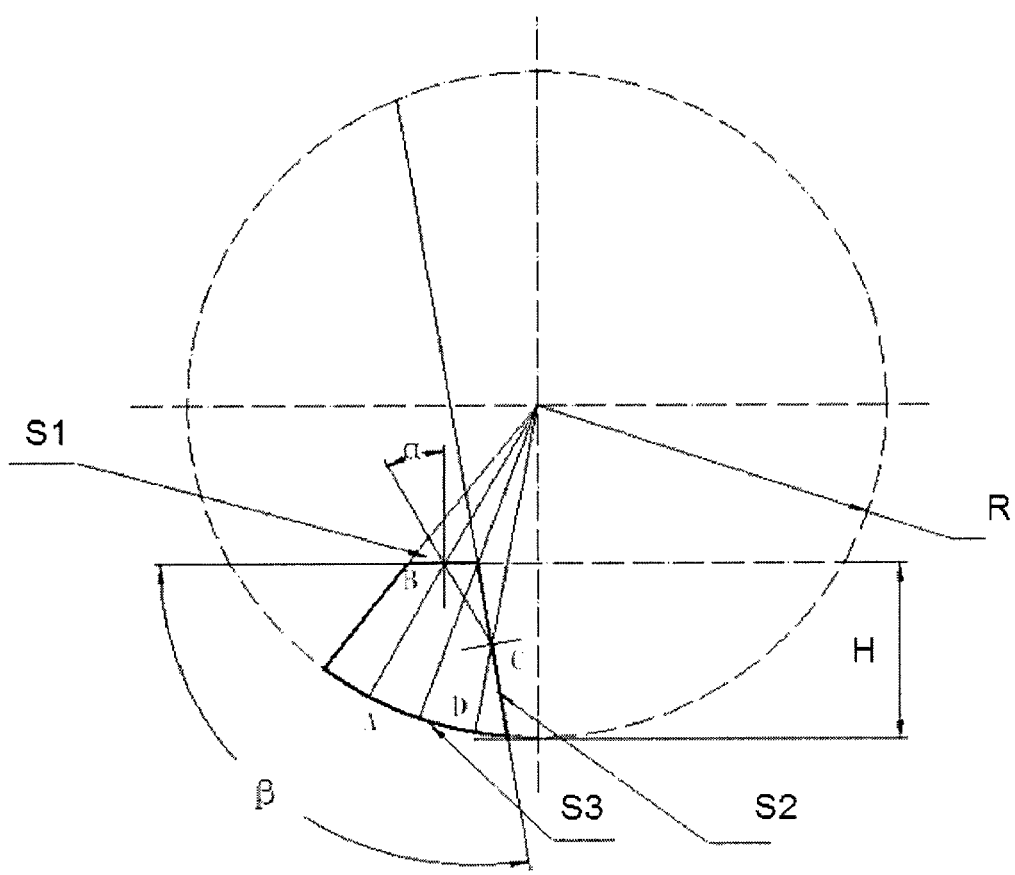
FIG. 2 schematically shows the structure of a monolithic folded confocal F-P cavity according to an embodiment of the disclosure.

FIG. 2 shows the structure of an F-P cavity according to a preferred embodiment of the disclosure. In the embodiment, the F-P cavity is constructed as a monolithic whose cross section has a shape formed by bold lines in FIG. 2. The monolithic is made of a single piece of optical material to form a folded confocal cavity. The monolithic folded confocal cavity has three reflection surfaces, wherein reflection surfaces S1 (a plane on which a reflection point B is located) and S2 (a plane on which a reflection point C is located) are planes, and a reflection surface S3 (a plane on which the reflections points A and D are located) is a spherical surface, curvature radius R of which is equal to half of a round trip geometric length of light in the folded cavity, i.e., R=AB+BC+CD, such that a folded confocal F-P cavity is formed by the light path returning back to the S3 surface from the S3 surface via the S1 and S2 surfaces.

As an embodiment, the monolithic confocal cavity is determined by:

$$\begin{cases} R - \dfrac{1}{\cos\alpha}[y + 2(R - H)] + \dfrac{y}{\cos(\pi - 2\beta + \alpha)} = 0 \\ y = -\dfrac{x}{\tan\alpha} - 2(R - H) \\ y = \dfrac{x}{\tan(\pi - 2\beta + \alpha)} \end{cases}$$

where R denotes curvature radius of a spherical segment, i.e. S3 surface, H denotes height of the spherical segment, $\alpha$ denotes a refractive angle of laser in the monolithic confocal cavity, $\beta$ denotes an obtuse angle of the monolithic confocal cavity, and (x, y) is coordinates of point C, i.e. the reflection point of the laser on a total-reflection surface, in a coordinate system established by using the circle center as an coordinate origin.

The S1 surface is plated with a reflection film with suitable reflectivity and transmittance in s and p polarization directions, the S2 surface serves as the total-reflection surface and may not be plated with a film, and the S3 surface is plated with a high reflectivity film. The magnitude of reflectivity of the reflection films plated on the S1 and S3 surfaces may be set according to the needs of actual application. In particular, the light path is as follows: light enters into the folded confocal F-P cavity from the B point on the input/output coupling surface S1 which also serving as a folding surface and advances in the following two ways: 1) being reflected back to the point B on the folding surface S1 after being normally incident at the point A on the reflection spherical surface S3 plated with a high reflectivity film, turning to the point C on the reflection surface S2, being normally incident on the point D on the reflection spherical surface after being totally-reflected at the point C, being reflected back to the point C and back to the point B on the folding surface S1 after being totally-reflected at the point C again; or otherwise 2) after entering the monolithic via S1, firstly being incident at the point C on S2 and being normally incident at the point D on the surface S3 after totally-reflected by S2, and being reflected back to the point C on S2 after being reflected at the point D, then back to the point B on the surface S1, after being folded at point B, being normally incident on the point A on the surface S3, then back to the point B on the surface S1 from the point A.

In the above two ways, refraction or output occurs while the light is folded-reflected at the point B of S1. The output light beam has two directions. One is propagating in the direction of the reflection light, coincide with or collinear with and in the same direction with the direct mirror reflection light on the surface S1, to form a total mirror reflection light of the incident light, which reaches a minimum power value at a resonance peak. The other is collinear with the incident light but in the opposite direction, to form a retro-incidentreflection light of the monolithic confocal cavity, which constitutes a complementary spectrum structure with the direct mirror reflection light and reaches a maximum power value at the resonance peak, the width of the resonance peak being determined by a fineness of the confocal cavity.

As shown in FIG. 2, the monolithic folded confocal F-P cavity is made of an optical quartz glass with low transmission loss. The folded cavity has 3 reflection surfaces, all of which have super-smooth surface finish. An angle between surfaces S1 and S2 is 99.3041°. The plane S1 serves as both the folding surface and the input/output coupling surface, has a length of 6 mm, and is plated with a reflection film of suitable reflectivity Rc, e.g. 0.95 to 0.98, by using optical plating techniques. The plane S2 is a folding surface, has a length of 15.9 mm, may not be plated, and realizes fold of the light beams by means of internal total reflection. The spherical surface S3 has a curvature radius of 30.2 mm, and a strict optical process guarantees that a sum of geometric length of AB, BC and CD is equal to the curvature radius of the spherical surface S3. The reflectivity of the spherical surface is larger than 99.9% in case of normal incidence. It is required that absorption and scattering of the plated films are less than 200 ppm.

A laser light beam of e.g. 689 nm wavelength is incident with a certain incident angle at the point B on a surface serving as both the folding surface and the input/output coupling surface, and reflection and refraction both occur at the point B. A portion of the light beam that is refracted into the folded confocal F-P cavity is normally incident at the point A on the curved surface plated with a high reflectivity film, returns back to the point B on the folding surface after being reflected at the point A, and is transmitted and reflected at the point B, wherein the reflected portion is incident at the point C with an angle larger than the total reflection. After being totally-reflected at the point C, the portion turns to the point D on the curved surface plated with a high reflectivity film, and returns back to the point C of the folding surface that is a total reflection surface after being reflected at the point D by means of normal incidence, and then back to the point B on the surface that serves as both the folding surface and the input/output coupling surface, and both transmission and reflection occur at the point B.

Among the transmitted light beams at the point B, a sum of the light beams which are collinear with but in a direction opposite to the incident light beam forms the retro-incident reflection light of the F-P cavity, the spectrum of which exhibits an structure opposite to that of transmitted light of a normal unfolded F-P cavity, i.e. the reflection light has the highest intensity at resonance frequency. A sum of the transmitted light beams in the direction of external reflected light beam is coherently added with the external direct reflection light beam to form a mirror reflected light beam, which has minimal intensity at the resonance frequency.

For the laser waveband transmitted within the F-P cavity, the monolithic optical element forming the F-P cavity may be made of a suitable optical glass, optical crystal or quartz glass. The F-P cavity may be made on a single optical material, or the folded confocal F-P cavity may be formed by combining more than two pieces of optical materials into one integral by means of gluing such as bonding or the like, and processing suitable optical surfaces on the material.

The monolithic folded confocal F-P cavity may use a temperature sensor and semiconductor cooler to realize temperature control. Through affixing piezoelectric ceramics and temperature controlling, fast fine tuning in small range and slow coarse tuning in large range can be achieved respectively, so that the resonance frequency of the monolithic folded confocal F-P cavity can be tuned and controlled.

The cavity in the above solution may use other shapes, other sizes, other angles, other laser wavelengths, other optical or laser materials, and other film parameters.

Figure 3:
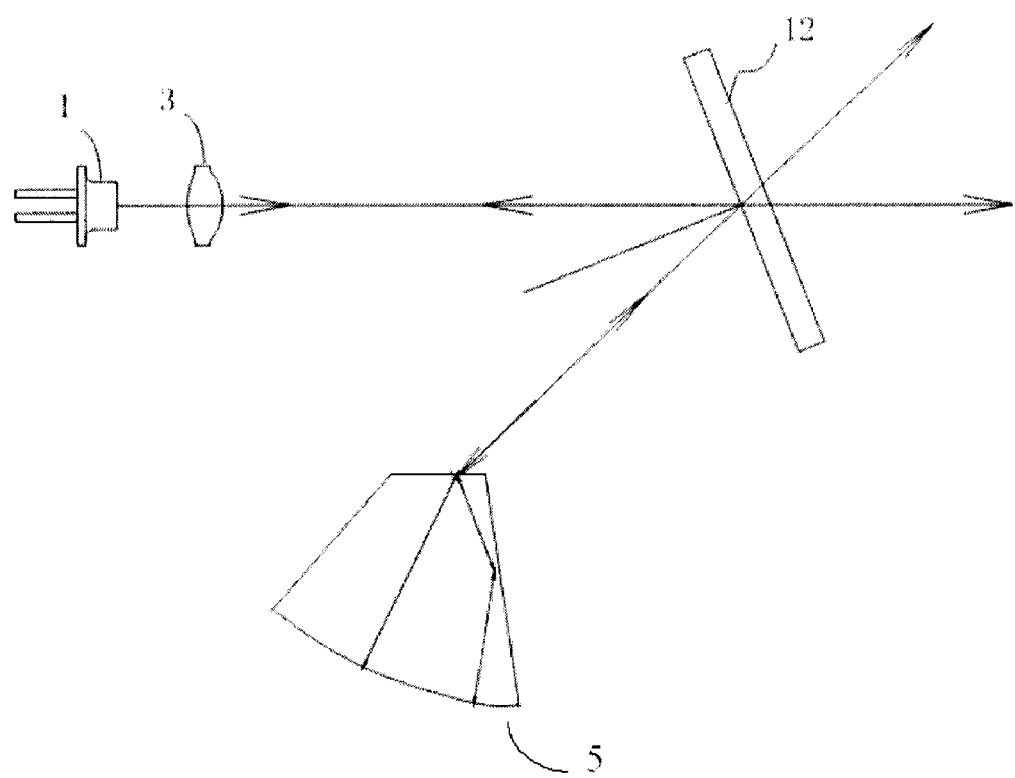
FIG. 3 schematically shows the structure of a semiconductor laser according to an embodiment of the disclosure.

The disclosure further provides a laser on the basis of the above monolithic folded confocal F-P cavity. FIG. 3 shows an embodiment of a semiconductor laser according to the disclosure, comprising: a semiconductor laser tube 1, a collimator (AL) 3, a beam splitter (BS) 12, and a monolithic folded confocal F-P cavity 5. It can be seen that, the present embodiment is formed by replacing the F-P cavity composed of discrete components in the solution of B. Dahmani, L. Hollberg, and R. Drullinger with the monolithic folded F-P cavity 5.

Semiconductor laser tube 1 may use semiconductor laser source such as semiconductor diode (LD), distributed feedback (DFB) semiconductor laser or the like. After laser light emitted by the semiconductor laser tube 1 is collimated by the collimator 3, a beam of the laser light divided by the beam splitter 12 with appropriate power enters into the monolithic folded confocal F-P cavity 5. After subjecting to the light path shown in FIG. 2 within monolithic folded confocal cavity 5, a retro-incidentreflection light returns to the semiconductor laser tube 1 via the beam splitter 12 along the path collinear with but in a direction opposite to the incident light. Since the F-P cavity has better frequency selection function, the frequency selection function of the overall laser resonance is greatly enhanced, so the frequency noise of the laser oscillation is further compressed, thereby narrowing the laser linewidth.

The output light of the semiconductor laser according to the disclosure can be adjusted in various manners, including:

1) arranging a resonance frequency adjustment system, which adjusts the resonance frequency determined by the monolithic folded F-P cavity 5 by varying the light path within the monolithic folded F-P cavity 5. For example, the adjustment can be implemented by varying the stress applied to the monolithic folded F-P cavity 5, the temperature adjustment manner (including a plurality of combining manners); and 2) arranging a laser oscillation frequency adjustment system, which adjusts the laser oscillation frequency determined by frequency selection of the beam splitter 12 by varying the distance from the beam splitter 12 to the monolithic folded F-P cavity 5 or by varying the distance from the beam splitter 12 to the semiconductor laser tube 1. For example, arranging the laser oscillation frequency adjustment system, such that the distance from the beam splitter 12 to the monolithic folded F-P cavity 5 or the distance from the beam splitter 12 to the semiconductor laser tube 1 is varied by moving the monolithic folded F-P cavity 5, or beam splitter 12, or semiconductor laser tube 1 along a certain trace, or by moving more than two of them simultaneously, while remaining the incident angle of the incident light split by the beam splitter 12 with respect to the monolithic folded F-P cavity 5 unchanged;

3) arranging a frequency range adjustment system for light output by the semiconductor laser tube 1, which varies the frequency range of light output by the semiconductor laser tube 1 by varying the input current, the temperature and the like of the semiconductor laser tube 1. For example, arranging a first frequency range adjustment system for light output by the semiconductor laser tube 1, which varies the input current of the semiconductor laser tube 1 through adjustment, and further arranging a second frequency range adjustment system for light output by the semiconductor laser tube 1, which varies the temperature of the semiconductor laser tube 1 through adjustment.

The above various adjustment manners of the adjustment systems can be arbitrarily combined for use. The wavelength or frequency of the laser output by the semiconductor laser can be varied by the above adjustment means. Further, in the preferred embodiment of the disclosure, in order to obtain the optimal laser outputting effect, peaks of the laser spectrums obtained by the above three adjustment manners should be made overlapped during adjustment.

Figure 4:
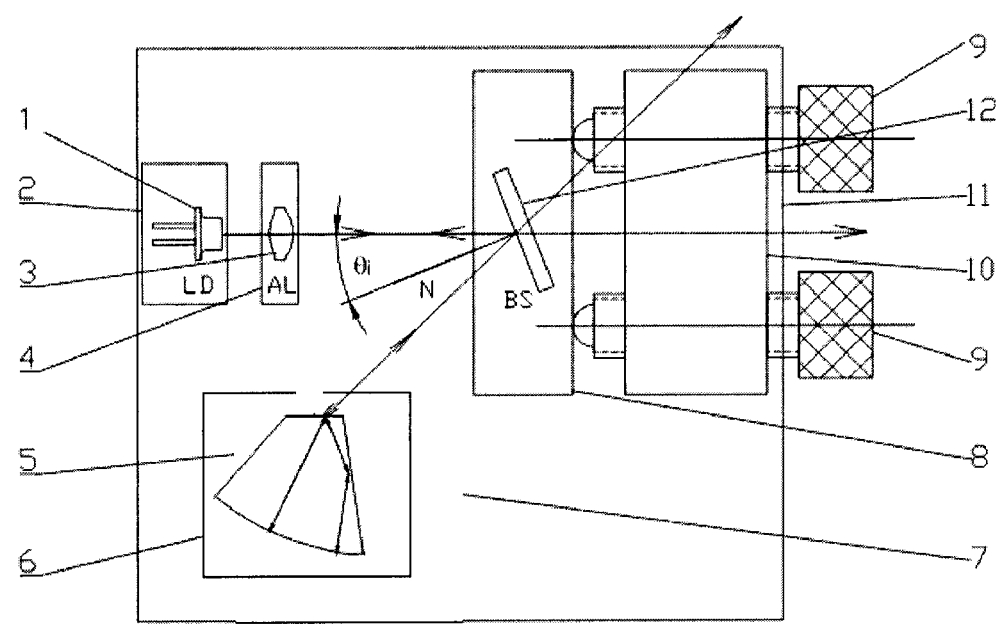
FIG. 4 schematically shows the structure of a semiconductor laser provided with adjustment systems according to an embodiment of the disclosure.

FIG. 4 schematically shows the structure of a monolithic folded F-P cavity feedback semiconductor laser with adjustment means according to an embodiment of the disclosure, the laser comprises a semiconductor laser tube 1, a heat sink for semiconductor laser tube 2, an aspheric collimator 3, an adjustable supporter for aspheric collimator 4, a monolithic folded F-P cavity 5, a heat sink for monolithic folded F-P cavity 6 for slow speed and large range frequency resonance, a piezoelectric ceramic 7 adhered to the monolithic folded F-P cavity 5, an adjuster movable plate 8 for adjusting a beam splitter 12, a fine-tuning screw 9, an adjuster fixed plate 10 fixed on a base plate 11, the base plate 11, and the beam splitter 12.

The heat sink for semiconductor laser tube 2 is used for controlling the temperature of the semiconductor laser tube 1 to thereby vary the frequency range of the light output by the semiconductor laser tube 1.

The heat sink for monolithic folded F-P cavity 6 controls the temperature of the monolithic folded F-P cavity 5, to thereby control the resonance frequency of the monolithic folded F-P cavity 5 through temperature vary, and finally adjust the frequency of output laser. Although thus control is slower than the control of piezoelectric ceramic 7, it has a wider range.

In this example, the piezoelectric ceramic 7 adhered to the monolithic folded F-P cavity 5 is in sheet form and adhered together with the monolithic folded F-P cavity 5, however, the piezoelectric ceramic 7 can be configured to have any shapes such as circle, rectangle, or other polygon as needed. As the voltage applied to piezoelectric ceramic 7 varies, the area of piezoelectric ceramic 7 varies correspondingly, resulting in the vary of the shape of the monolithic folded F-P cavity 5, and thus varying the resonance frequency of the resonance cavity and finally accomplishing the adjustment of output laser frequency. As compared with the adjustment of the heat sink for monolithic folded F-P cavity 6, the piezoelectric ceramic 7 can perform frequency adjustment more rapidly, finely and accurately.

The adjuster movable plate 8, fine-tuning screw 9, and adjuster fixed plate 10 are used for adjusting the beam splitter 12. The beam splitter 12 is provided on the adjuster movable plate 8, and the fine-tuning screw 9 is provided on the adjuster fixed plate 10. In the light path calibration system, the fine-tuning screw 9 rotates, leading to rotation of adjuster movable portion 8, to thereby guarantee alignment between light beams of the semiconductor laser tube 1 and the monolithic folded F-P cavity 5. The adjustment system is also applicable to the monolithic folded F-P cavity 5, i.e. fixing the adjuster movable plate 8 to the monolithic folded F-P cavity 5 and arranging the fine-tuning screw 9 and the adjuster fixed plate 10 at corresponding positions, while remaining the beam splitter 12 fixed, and adjusting the monolithic folded F-P cavity 5 to guarantee alignment between light beams of the semiconductor laser tube 1 and the monolithic folded F-P cavity 5. In addition, a piezoelectric ceramic may be used for moving the adjuster movable plate 8, for example, arranging the piezoelectric ceramic between the fine-tuning screw 9 and the adjuster movable plate 8 to obtain more accurate adjustment.

The heat sink for monolithic folded F-P cavity 6 and the piezoelectric ceramic 7 adhered to the monolithic folded F-P cavity 5 construct the resonance frequency adjustment system; the adjuster movable plate 8, the fine-tuning screw 9, and the adjuster fixed portion 10 construct the light path calibration system; and the heat sink for semiconductor laser tube 2 constructs the frequency range adjustment system for light output by the semiconductor laser tube 1.

In addition, a laser oscillation frequency adjustment system may be arranged in the laser shown in FIG. 4, which adjusts the laser oscillation frequency determined by frequency selection of the beam splitter 12, by varying the distance from the beam splitter 12 to the monolithic folded F-P cavity 5, or varying the distance from the beam splitter 12 to the semiconductor laser tube 1. For example, setting customary mechanical structure such as screw and piezoelectric ceramic for moving the monolithic folded F-P cavity 5 or the beam splitter 12 or the semiconductor laser tube 1, to thereby vary the distance from the beam splitter 12 to the monolithic folded F-P cavity 5 or vary the distance from the beam splitter 12 to the semiconductor laser tube 1 by moving the monolithic folded F-P cavity 5, or beam splitter 12, or semiconductor laser tube 1 along a certain trace, or by moving more than two of them simultaneously, while remaining the incidence angle of the incident light split by the beam splitter 12 with respect to the monolithic folded F-P cavity 5 unchanged.

As another embodiment of the semiconductor laser of the disclosure, the beam splitter in FIGS. 3 and 4 may be replaced with a grating; the components in the semiconductor laser are arranged such that laser light emitted by the semiconductor laser diode, after collimated by the collimator, enters the grating, and the light beam diffracted by the grating is incident on the monolithic folded confocal F-P cavity; the retro-incidentreflection light of the monolithic folded confocal F-P cavity is returned to the semiconductor laser tube via the grating along a path collinear with but in a direction opposite to the original incident light beam.

The grating may be a transmission diffraction grating, and the light beam that is incident on the monolithic folded confocal F-P cavity after being diffracted by the grating is preferably a first-order diffracted light.

In addition to the semiconductor laser tube, the laser source of the laser of the disclosure may be other types of laser source.

Those skilled in the art should appreciate that, the embodiments illustrated above merely are specific embodiments of the disclosure and cannot be construed as limitations to the disclosure. Any modifications, equivalent substitutions, variations made within the spirit and principle of the disclosure shall be regarded as within the scope of protection of the disclosure.

What is claimed is:

1. A monolithic optical element for a monolithic folded confocal Fabry-Perot (F-P) cavity, comprising:
    a first reflection surface, the first reflection surface being a plane surface and serving as an input/output coupling surface;
    a second reflection surface, the second reflection surface being a plane surface; and
    a third reflection surface, the third reflection surface being a spherical surface, a curvature radius of the third reflection surface being equal to one-half of a round trip geometric length of light in the folded confocal cavity.

2. A monolithic optical element according to claim 1, wherein the first, second, and third reflection surfaces are arranged so that the light:
    enters into the folded confocal F-P cavity from an incident position on the first reflection surface and is normally incident on the third reflection surface,
    returns, after being reflected by the third reflection surface, to the incident position on the first reflection surface,
    turns, after being reflected by the first reflection surface, to the second reflection surface and
    is normally incident on the third reflection surface along a path after being totally-reflected by the second reflection surface,
    returns, after being reflected by the third reflection surface, to the second reflection surface along an opposite direction of the path, and
    returns, after being totally-reflected by the second reflection surface again, to the incident position on the first reflection surface; or
    the light:
    enters into the folded confocal F-P cavity from the incident position on the first reflection surface and is incident on the second reflection surface,
    is normally incident on the third reflection surface along a path after being totally-reflected by the second reflection surface,
    returns, after being reflected by the third reflection surface, to the second reflection surface along an opposite direction of the path,
    returns, after being totally-reflected by the second reflection surface again, to the incident position on the first reflection surface,
    is normally incident on the third reflection surface after being reflected by the first reflection surface, and
    returns, after being reflected by the third reflection surface, to the incident position on the first reflection surface.

3. A monolithic optical element according to claim 1, wherein the monolithic folded confocal F-P cavity satisfies:

$$\begin{cases} R - \frac{1}{\cos\alpha}[y + 2(R - H)] + \frac{y}{\cos(\pi - 2\beta + \alpha)} = 0 \\ y = -\frac{x}{\tan\alpha} - 2(R - H) \\ y = \frac{x}{\tan(\pi - 2\beta + \alpha)} \end{cases}$$

where:
    R denotes the curvature radius of the third reflection surface,
    H denotes a maximum vertical distance from the spherical surface on which the third reflection surface locates to the first reflection surface,
    α denotes a refractive angle at which the light enters into the monolithic confocal cavity,
    β denotes an obtuse angle formed by the first and second reflection surfaces, and
    (x, y) denotes coordinates of a reflection position of the light on the second reflection surface, in a coordinate system established by using a circle center of the third reflection surface as a coordinate origin.

4. A monolithic optical element according to claim 1, wherein, depending on a wavelength of the light, the second reflection surface is not coated with a film or is coated with a high reflectivity film.

5. A monolithic optical element according to claim 1, wherein the monolithic optical element is made of an optical glass, an optical crystal, or a quartz glass.

6. A laser using a monolithic optical element according to any one of claims 1-5 as its F-P cavity.

7. A laser according to claim 6, further comprising:
    a semiconductor laser tube;
    a collimator; and
    a beam splitter,
    wherein the laser is formed so that a laser beam emitted by the semiconductor laser tube, after being collimated by the collimator, is split by the beam splitter into at least two beams, and one of the at least two beams is incident on the monolithic folded confocal F-P cavity,
    wherein a retro-incident reflection light from the monolithic folded confocal F-P cavity returns to the semiconductor laser tube via the beam splitter along a path collinear with but in a direction opposite to a path of the laser beam emitted by the semiconductor laser tube.

8. A laser according to claim 7, further comprising one or more of following adjustment systems:
    a resonance frequency adjustment system, which adjusts a resonance frequency of the monolithic folded F-P cavity by varying a light path of the monolithic folded F-P cavity;
    a laser oscillation frequency adjustment system, which adjusts the laser oscillation frequency determined by a frequency selection of the beam splitter by varying a distance from the beam splitter to the monolithic folded F-P cavity or a distance from the beam splitter to the semiconductor laser tube;
    a first frequency range adjustment system, which varies a frequency range of the laser beam output by the semiconductor laser tube by varying an input current of the semiconductor laser tube; and
    a second frequency range adjustment system, which varies the frequency range of the laser beam output by the semiconductor laser tube by varying a temperature of the semiconductor laser tube.

9. A laser according to claim 6, further comprising:
a semiconductor laser tube;
a collimator; and
a grating,
wherein the laser is formed so that a laser beam emitted by the semiconductor laser tube, after being collimated by the collimator, is split by the grating into at least two beams, and one of the at least two beams is incident on the monolithic folded confocal F-P cavity,
wherein a retro-incident reflection light from the monolithic folded confocal F-P cavity returns to the semiconductor laser tube via the grating along a path collinear with but in a direction opposite to a path of the laser beam emitted by the semiconductor laser tube.

10. A laser according to claim 9, further comprising a half wave plate arranged between the collimator and the beam splitter.

* * * * *